(12) United States Patent
Yim et al.

(10) Patent No.: US 9,659,765 B2
(45) Date of Patent: May 23, 2017

(54) ENHANCEMENT OF MODULUS AND HARDNESS FOR UV-CURED ULTRA LOW-K DIELECTRIC FILMS

(71) Applicant: Applied Materials, Inc., Santa Clara, CA (US)

(72) Inventors: Kang Sub Yim, Palo Alto, CA (US); Mahendra Chhabra, San Jose, CA (US); Kelvin Chan, San Ramon, CA (US); Alexandros T. Demos, Fremont, CA (US); Priyanka Dash, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/799,988

(22) Filed: Jul. 15, 2015

(65) Prior Publication Data

US 2016/0020090 A1    Jan. 21, 2016

Related U.S. Application Data

(60) Provisional application No. 62/026,843, filed on Jul. 21, 2014.

(51) Int. Cl.
| H01L 21/31 | (2006.01) |
| H01L 21/469 | (2006.01) |
| H01L 21/02 | (2006.01) |
| H01L 21/3105 | (2006.01) |
| H01L 21/027 | (2006.01) |

(52) U.S. Cl.
CPC .... H01L 21/02203 (2013.01); H01L 21/3105 (2013.01); H01L 21/0272 (2013.01); H01L 21/02126 (2013.01)

(58) Field of Classification Search
CPC ........... H01L 21/02203; H01L 21/3105; H01L 21/02348
See application file for complete search history.

(56) References Cited

U.S. PATENT DOCUMENTS

| 7,265,061 B1 | 9/2007 | Cho et al. |
| 8,346,068 B2 | 1/2013 | Shim et al. |
| 8,454,750 B1 | 6/2013 | Shrinivasan et al. |
| 8,753,449 B2 | 6/2014 | Chhabra et al. |
| 2002/0190054 A1* | 12/2002 | Ito ..................... H01L 21/67103 219/444.1 |
| 2011/0183525 A1* | 7/2011 | Purushothaman ........................ H01L 21/02203 438/778 |

(Continued)

Primary Examiner — Zandra Smith
Assistant Examiner — John M Parker
(74) Attorney, Agent, or Firm — Patterson + Sheridan, LLP

(57) ABSTRACT

Embodiments described herein generally relate to methods for processing a dielectric film on a substrate with UV energy. In one embodiment, a precursor film is deposited on the substrate, and the precursor film includes a plurality of porogen molecules. The precursor film is first exposed to UV energy at a first temperature to initiate a cross-linking process. After a first predetermined time, the temperature of the precursor film is increased to a second temperature for a second predetermined time to remove porogen molecules and to continue the cross-linking process. The resulting film is a porous low-k dielectric film having improved elastic modulus and hardness.

15 Claims, 2 Drawing Sheets

(56) References Cited

U.S. PATENT DOCUMENTS

| | | | |
|---|---|---|---|
| 2011/0241200 A1* | 10/2011 | Dimitrakopoulos | H01L 21/02126 |
| | | | 257/734 |
| 2012/0329273 A1* | 12/2012 | Bruce ............... | H01L 21/02203 |
| | | | 438/653 |
| 2014/0004717 A1 | 1/2014 | Chan et al. | |
| 2015/0262865 A1* | 9/2015 | Liu ................... | H01L 21/76825 |
| | | | 438/676 |

* cited by examiner

ENHANCEMENT OF MODULUS AND HARDNESS FOR UV-CURED ULTRA LOW-K DIELECTRIC FILMS

CROSS-REFERENCE TO RELATED APPLICATIONS

This application claims priority to U.S. Provisional Patent Application Ser. No. 62/026,843, filed on Jul. 21, 2014, which herein is incorporated by reference.

BACKGROUND

Field

Embodiments disclosed herein generally relate to films having a low dielectric constant for use in semiconductor fabrication, more particularly, to methods for processing a dielectric film on a substrate with ultraviolet (UV) energy.

Description of the Related Art

Materials with low dielectric constants (low-k), such as carbon doped silicon oxides, find extremely widespread use in the fabrication of semiconductor devices. Using low-k materials as the inter-metal and/or inter-layer dielectric layer between conductive interconnects reduces the delay in signal propagation due to capacitive effects. The lower the dielectric constant of the dielectric layer, the lower the capacitance of the dielectric and the lower the RC delay of the integrated circuit (IC).

Current efforts are focused on improved low-k dielectric materials, often referred to as ultra low-k (ULK) dielectrics, with k values less than 2.5 for the most advanced technology needs. Ultra low-k dielectric materials may be obtained by, for example, incorporating air voids within a low-k dielectric matrix, creating a porous dielectric material. Methods of fabricating porous dielectrics typically involve forming a "precursor film" containing two components: a porogen (typically an organic material such as a hydrocarbon) and a structure formed of a dielectric material (e.g., a silicon containing material). Once the precursor film is formed on the substrate, the porogen component can be removed using a thermal process, such as an ultraviolet (UV) curing process, leaving a structurally intact porous dielectric matrix or oxide network. After the porogen is removed, the UV curing process strengthens the film by cross-linking the matrix, e.g., Si—O—Si or Si—C—Si chains in the carbon doped silicon oxides, yielding a low-k film that is both mechanically and chemically stronger.

However, using the above mentioned method, the resulting porous low-k dielectric film has reduced elastic modulus and reduced hardness. Therefore, a need exists to increase elastic modulus and increase hardness while maintaining the film properties of deposited ultra low-k dielectric materials.

SUMMARY

Embodiments described herein generally relate to methods for processing a dielectric film on a substrate with UV energy. In one embodiment, a precursor film is deposited on the substrate, and the precursor film includes a plurality of porogen molecules. The precursor film is first exposed to UV energy at a first temperature from about 325 degrees Celsius to about 350 degrees Celsius to initiate a cross-linking process. After a first predetermined time of about 20 seconds to about 30 seconds, the temperature of the precursor film is increased to a second temperature from about 355 degrees Celsius to about 400 degrees Celsius for a second predetermined time of about 200 seconds to about 240 seconds to remove porogen molecules and to continue the cross-linking process. The resulting film is a porous low-k dielectric film having superior elastic modulus and hardness.

In one embodiment, a method includes forming a precursor film on a substrate, and the precursor film contains a plurality of porogen molecules. The method further includes exposing the precursor film to UV energy at a first temperature from about 325 degrees Celsius to about 350 degrees Celsius for a first predetermined time from about 20 seconds to about 30 seconds to initiate a cross-linking process, and heating the precursor film to a second temperature from about 355 degrees Celsius to about 400 degrees Celsius for a second predetermined time from about 200 seconds to about 240 seconds while exposing the precursor film to the UV energy to remove porogen molecules and to continue the cross-linking process.

In another embodiment, a method for forming a porous low-k dielectric film is disclosed. The method includes directing UV energy to a processing region of a processing chamber, placing a substrate into the processing region, where a precursor film disposed on the substrate is receiving the UV energy, and the precursor film contains a plurality of porogen molecules. The method further includes heating the substrate to a first determined temperature from about 355 degrees Celsius to about 400 degrees Celsius for a first predetermined time from about 200 seconds to about 240 seconds, and removing the substrate from the processing region.

In another embodiment, a method includes exposing a precursor film to UV energy at a first temperature from about 325 degrees Celsius to about 350 degrees Celsius for a first predetermined time to initiate a cross-linking process, the precursor film contains a plurality of porogen molecules, and heating the precursor film to a second temperature for a second predetermined time while exposing the precursor film to the UV energy to remove porogen molecules and to continue the cross-linking process. The second temperature is greater than the first temperature.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to methods for processing a dielectric film on a substrate with UV energy. In one embodiment, a precursor film is deposited on the substrate, and the precursor film includes a plurality of porogen molecules. The precursor film is first exposed to UV energy at a first temperature to initiate a cross-linking process. After a first predetermined time, the temperature of the precursor film is increased to a second temperature for a second predetermined time to remove porogen molecules and to continue the cross-linking process. The resulting film is a porous low-k dielectric film having improved elastic modulus and hardness.

Figure 1:
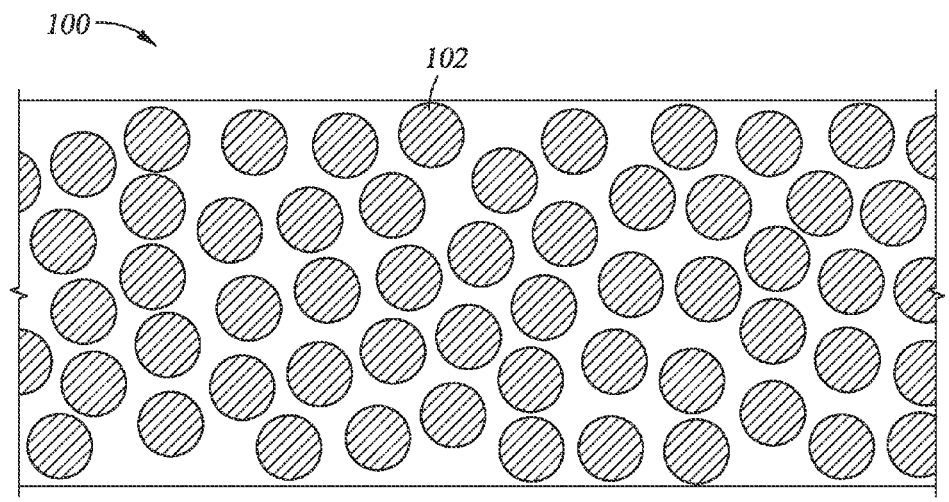
FIG. 1 shows a precursor film according to embodiments described herein.

FIG. 1 shows a precursor film 100 according to embodiments described herein. The precursor film 100 may be a dielectric film having a plurality of porogen molecules 102 formed therein. The precursor film 100 may comprise $SiO_2$, SiOC, SiON, SiCOH, SiOCN, or other suitable dielectric material. In one embodiment, the precursor film 100 is an organosilicate glass (OSG, also known as SiCOH) which is a silicon oxide containing carbon and hydrogen atoms. The precursor film 100 may be deposited on a substrate, such as a silicon substrate having a previously formed layer, such as a metallization or interconnect layer. The plurality of porogen molecules 102 embedded in the precursor film 100 may include cyclooctene, cycloheptene, cyclooctane, cycloheptane, cyclohexene, cyclohexane, or bicyclic chemicals and mixtures thereof. The precursor film 100 may be deposited on the substrate by a thermal chemical vapor deposition (CVD) process, a plasma enhanced CVD (PECVD) process, an atomic radical CVD (ARCVD), or any suitable deposition process.

Figure 2:
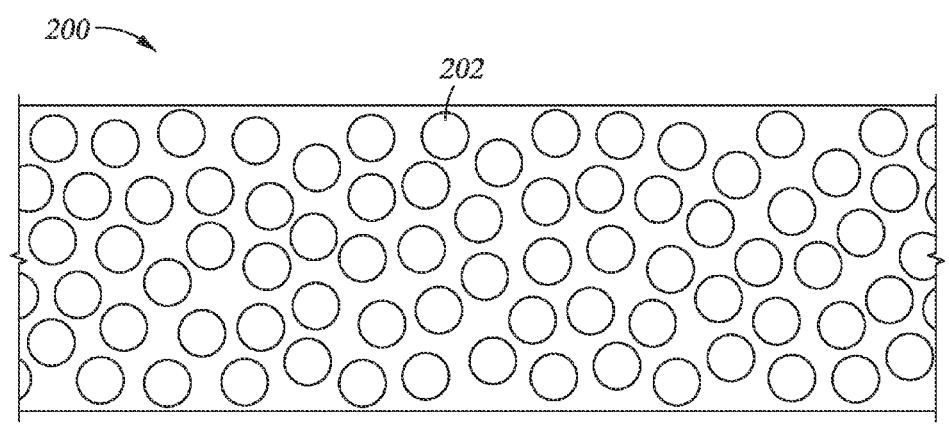
FIG. 2 shows a porous low-k dielectric film having improved elastic modulus and hardness according to embodiments described herein.

FIG. 2 illustrates a porous low-k dielectric film 200 having improved elastic modulus and hardness according to embodiments described herein. The porous low-k dielectric film 200 may be the resulting film after the precursor film 100 is first exposed to UV energy at a first temperature for a first predetermined time to initiate a cross-linking process, and then heated to a second temperature for a second predetermined time while exposed to UV energy to remove porogen molecules and to continue the cross-linking process. The porous low-k dielectric film 200 may include a plurality of pores 202. In one embodiment, the first temperature may be between about 325 degrees Celsius and about 350 degrees Celsius, and the first predetermined time may be between about 20 seconds and about 30 seconds. The second temperature may be between about 355 degrees Celsius and about 400 degrees Celsius, and the second predetermined time may be between about 200 seconds and about 240 seconds. With the precursor film first exposed to UV energy at a lower temperature followed by increasing the temperature while the precursor film is still exposed to UV energy, the resulting porous low-k dielectric film has an improved elastic modulus and hardness. In one embodiment, the elastic modulus and the hardness are improved by at least 15 percent.

During the first predetermined time, the precursor film 100 may start cross-linking, causing the precursor film 100 to be more stable. However, the first temperature may not be over 350 degrees Celsius, and the second temperature may be higher than the first temperature. At a higher temperature, the porogen molecules 102 are removed from the precursor film 100 at a faster rate than at a lower temperature. A faster porogen removal leads to a higher shrinkage rate of the precursor film, causing the resulting dielectric film to have reduced elastic modulus and hardness.

Figure 3:
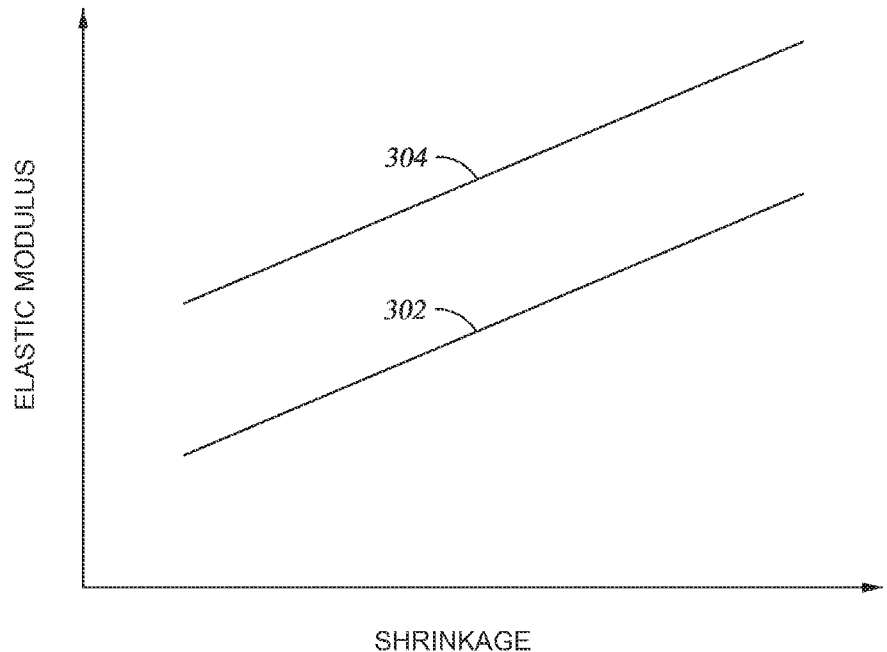
FIG. 3 is a chart showing a relationship between film shrinkage and elastic modulus according to one embodiment described herein.

FIG. 3 is a chart showing a relationship between film shrinkage and elastic modulus according to one embodiment described herein. Line 302 shows a relationship between film shrinkage and elastic modulus for a porous low-k dielectric film formed when the precursor film is exposed to UV energy at about 400 degrees Celsius for about 180 seconds. Line 304 shows a relationship between film shrinkage and elastic modulus for a porous low-k dielectric film formed when the precursor film is exposed to UV energy at a first temperature that is less than or equal to about 350 degrees Celsius for about 20 seconds to about 30 seconds and then the temperature is increased to about 400 degrees Celsius for about 210 seconds to about 220 seconds. The time for converting the precursor film to the porous low-k dielectric film is longer for line 304 compared to line 302, since the porogen molecules in the precursor film for line 304 is removed at a slower rate compare to the precursor film for line 302. As shown in FIG. 3, line 304 shows a higher elastic modulus at the same film shrinkage comparing to line 302.

Figure 4:
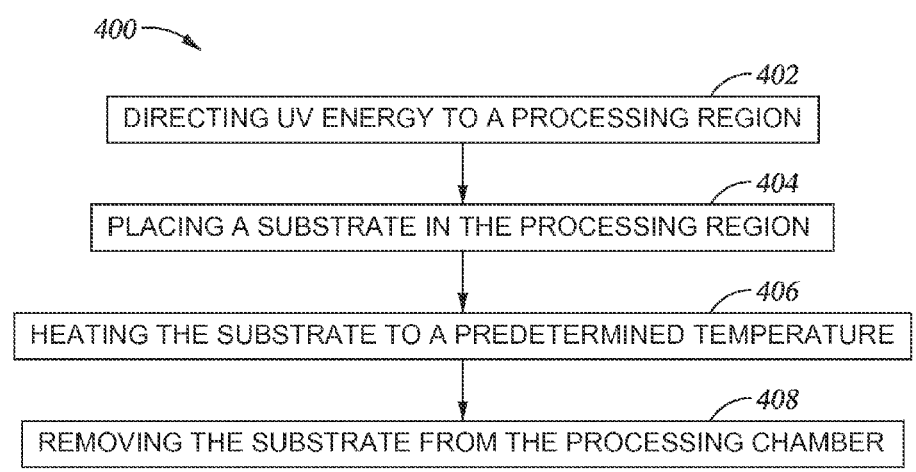
FIG. 4 illustrate a process for forming the porous low-k dielectric film having improved elastic modulus and hardness according to embodiments described herein.

FIG. 4 illustrate a process 400 for forming the porous low-k dielectric film having improved elastic modulus and hardness according to embodiments described herein. At block 402, UV energy is directed to a processing region. The UV energy may be generated in one or more UV lamps, which may be disposed above the processing region. The processing region may be within a processing chamber. The one or more UV lamps may be turned on to deliver UV energy to the processing region. Next, at block 404, a substrate having a precursor film disposed thereon is placed in the processing region. The precursor film may be the precursor film 100 shown in FIG. 1. The substrate may be transferred from a deposition chamber to the processing chamber. In one embodiment, the deposition chamber and the processing chamber are both coupled to a cluster tool. As the substrate enters the processing region, UV energy from the one or more UV lamps initiates the cross-linking process in the precursor film disposed on the substrate, and the substrate is at a temperature that ranges from about 325 degrees Celsius to about 350 degrees Celsius. The temperature of the substrate may be resulted from the deposition process of depositing the precursor film on the substrate, or from the exposure to the UV energy. The substrate is placed on a substrate support disposed in the processing chamber.

After a predetermined time, such as from about 20 seconds to about 30 seconds, the temperature of the substrate may be raised to a predetermined temperature, such as from about 355 degrees Celsius to about 400 degrees Celsius, as shown in block 406. The substrate support may have heating elements embedded therein to heat the substrate. The substrate may be exposed to UV energy at the predetermined temperature for about 200 seconds to about 240 seconds. During this time, the porogen molecules are removed and the precursor film is converted to a porous low-k dielectric film, such as the porous low-k dielectric film 200 shown in FIG. 2.

Next, at block 408, the substrate having the porous low-k dielectric film disposed thereon is removed from the processing region. The one or more UV lamps may be turned on during the transferring of the substrate into and out of the processing region. The one or more UV lamps may be turned on during blocks 404, 406, 408, thus the substrate is exposed to UV energy at different temperatures.

A method for forming porous low-k dielectric film is disclosed. The method includes exposing a precursor film to UV energy at different temperatures. Initially the precursor film is at a lower temperature, and the UV energy starts the cross-linking process in the precursor film. The temperature of the precursor film is then increased, and porogen molecules in the precursor film are removed due to UV energy exposure and the elevated temperature. The resulting porous low-k dielectric film has improved elastic modulus and hardness.

While the foregoing is directed to embodiments, other and further embodiments may be devised without departing from the basic scope thereof, and the scope thereof is determined by the claims that follow.

The invention claimed is:

1. A method for forming a porous low-k dielectric film, comprising:
   directing UV energy to a processing region of a processing chamber;
   placing a substrate into the processing region, wherein a precursor film containing a plurality of porogen molecules is disposed on the substrate, and the precursor film is receiving the UV energy as the substrate is entering the processing region;
   heating the substrate to a first predetermined temperature from about 355 degrees Celsius to about 400 degrees Celsius for a first predetermined time from about 200 seconds to about 400 seconds; and
   removing the substrate from the processing region.

2. The method of claim 1, further comprising forming the precursor film on the substrate in a deposition chamber prior to placing the substrate into the processing region.

3. The method of claim 1, wherein the porogen molecules are removed during the first predetermined time.

4. The method of claim 1, further comprising exposing the precursor film to UV energy at a second predetermined temperature for a second predetermined time to initiate a cross-linking process prior to heating the substrate to the first predetermined temperature, wherein the second predetermined temperature is less than the first predetermined temperature and the second predetermined time is less than the first predetermined time.

5. The method of claim 4, wherein the second predetermined time ranges from about 20 seconds to about 30 seconds.

6. The method of claim 4, wherein the second predetermined temperature ranges from about 325 degrees Celsius to about 350 degrees Celsius.

7. The method of claim 1, wherein the precursor film is receiving UV energy as the substrate is removed from the processing region.

8. A method for forming a porous low-k dielectric film, comprising:
   directing UV energy to a processing region of a processing chamber;
   initiating a cross-linking process in a precursor film formed on a substrate as the substrate is entering the processing region of the processing chamber;
   heating the substrate to a first predetermined temperature from about 355 degrees Celsius to about 400 degrees Celsius for a first predetermined time from about 200 seconds to about 400 seconds; and
   removing the substrate from the processing region.

9. The method of claim 8, wherein the precursor film contains a plurality of porogen molecules.

10. The method of claim 9, wherein the porogen molecules are removed during the first predetermined time.

11. The method of claim 8, wherein the substrate is at a second predetermined temperature for a second predetermined time during the initiating a cross-linking process.

12. The method of claim 11, wherein the second predetermined time ranges from about 20 seconds to about 30 seconds.

13. The method of claim 11, wherein the second predetermined temperature ranges from about 325 degrees Celsius to about 350 degrees Celsius.

14. The method of claim 8, wherein the precursor film is receiving UV energy as the substrate is entering from the processing region.

15. The method of claim 8, wherein the precursor film is receiving UV energy as the substrate is removed from the processing region.

* * * * *